(12) United States Patent
Lee et al.

(10) Patent No.: US 8,084,846 B2
(45) Date of Patent: Dec. 27, 2011

(54) BALANCED SEMICONDUCTOR DEVICE PACKAGES INCLUDING LEAD FRAME WITH FLOATING LEADS AND ASSOCIATED METHODS

(75) Inventors: Teck Kheng Lee, Singapore (SG); Kian Chai Lee, Singapore (SG); Vanessa Chong Hui Van, Singapore (SG)

(73) Assignee: Micron Technology, Inc., Boise, ID (US)

( * ) Notice: Subject to any disclaimer, the term of this patent is extended or adjusted under 35 U.S.C. 154(b) by 928 days.

(21) Appl. No.: 11/606,497

(22) Filed: Nov. 29, 2006

(65) Prior Publication Data

US 2008/0122072 A1  May 29, 2008

(51) Int. Cl.
 *H01L 23/34* (2006.01)
(52) U.S. Cl. ............... 257/666; 257/676; 257/E23.037
(58) Field of Classification Search ........... 257/666, 257/686, 676, 723, E23.037
See application file for complete search history.

(56) References Cited

U.S. PATENT DOCUMENTS

| | | | |
|---|---|---|---|
| 5,585,668 A * | 12/1996 | Burns | 257/676 |
| 6,476,474 B1 * | 11/2002 | Hung | 257/686 |
| 6,552,416 B1 | 4/2003 | Foster | |
| 7,408,245 B2 * | 8/2008 | Hung et al. | 257/666 |
| 7,728,411 B2 * | 6/2010 | Lee et al. | 257/666 |
| 2003/0067059 A1 | 4/2003 | Corisis | 257/666 |
| 2003/0189256 A1 | 10/2003 | Corisis et al. | |
| 2004/0164392 A1 | 8/2004 | Lee | |
| 2006/0043542 A1 | 3/2006 | Corisis | |

OTHER PUBLICATIONS

Singapore Search Report for Singapore Application No. 2007002660 dated Jul. 13, 2010, 8 pages.
Singapore Written Opinion for Singapore Application No. 2007002660 dated Jul. 14, 2010, 14 pages.

* cited by examiner

*Primary Examiner* — Roy K Potter
(74) *Attorney, Agent, or Firm* — TraskBritt (57) ABSTRACT

A semiconductor device assembly or package includes at least one semiconductor device that is positioned adjacent to floating leads. Such an assembly or package may include at least two semiconductor devices that face opposite directions from one another, with each being oriented such that bond pads thereof are at an opposite side of the assembly or package from bond pads of the other. Alternatively, an assembly or package may include a lead assembly with an internal portion, including one or more floating leads, and an external portion that are in planes that are offset relative to one another. Methods for designing lead frames, assemblies, and packages are also disclosed, as are assembly and packaging methods.

25 Claims, 7 Drawing Sheets

BALANCED SEMICONDUCTOR DEVICE PACKAGES INCLUDING LEAD FRAME WITH FLOATING LEADS AND ASSOCIATED METHODS

BACKGROUND OF THE INVENTION

1. Field of Invention

The present invention relates generally to leads for use in packaging semiconductor devices and, more specifically, to leads that are configured to extend at least partially across a semiconductor device. Leads that incorporate teachings of the present invention may facilitate substantial balancing of one or more physical characteristics of a semiconductor device assembly or package that includes the leads, while minimizing the thickness of the assembly or package. The present invention also relates to methods associated with the lead frames, including, but not limited to, methods for designing lead assemblies, semiconductor device assemblies, and semiconductor device packages, as well as to methods for assembling and packaging semiconductor devices.

2. Related Art

A variety of approaches have been taken in the semiconductor device industry to meet demands for ever-increasing density and ever-increasing speed. One such approach has been to incorporate multiple semiconductor devices into a single package. These so-called "multi-chip modules," or "MCMs," have been configured a number of different ways, depending, in part, upon the types of semiconductor devices included therein, as well as the connection patterns of the semiconductor devices.

Some multi-chip modules include semiconductor devices that are identical in function and that have identical connection patterns. When the bond pads of each semiconductor device of an MCM are all located at or near a single edge thereof, so-called "shingle stack" or "stepped" configurations may be employed. In such an arrangement, the bond pads of each lower semiconductor device are exposed beyond an adjacent peripheral edge of the next-higher semiconductor device. Identical bond pads of the semiconductor devices may be electrically connected to one another to minimize the number of electrical connections needed in the resulting package, as well as to minimize the number of input/output elements, such as leads, that are needed.

As all of the bond pads are at one side of a conventional shingle stack assembly, an interposer, redistribution layer, or similar, thickness-consuming element must be incorporated into the assembly to balance the number of leads that protrude from opposite sides of the assembly. The presence of such an element undesirably increases the volume and, thus, prevents maximization of the density of conventional shingle stack packages.

Figure 1:
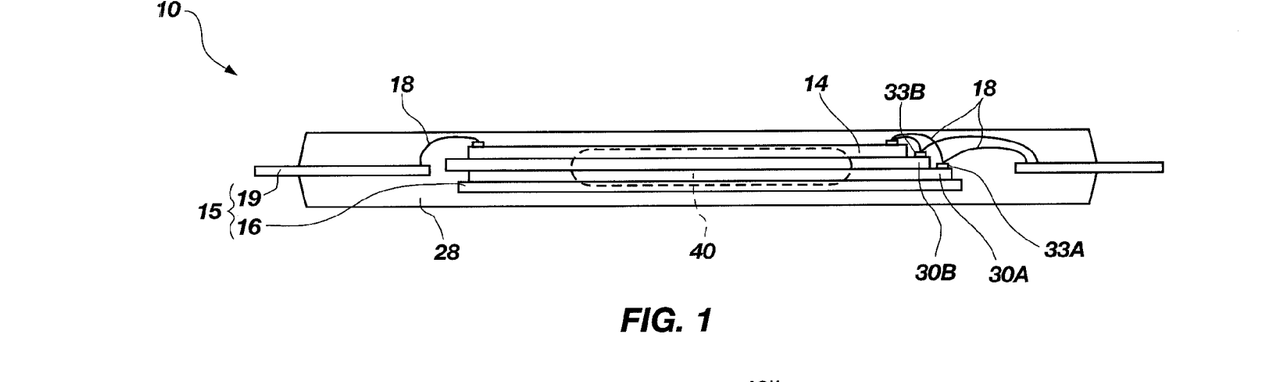
FIG. 1 is a cross-sectional representation of a conventional "shingle stack" package.

Moreover, by arranging semiconductor devices in a "shingle stack," the heat generated during operation of the semiconductor devices may be concentrated or focused within a particular area of the package, magnifying problems (e.g., warpage, delamination, broken electrical connections, cracked encapsulant, etc.) that may occur due to thermal (or coefficient of thermal expansion, or "CTE") mismatch between the various elements of the package. FIG. 1 illustrates this phenomenon. In FIG. 1, an MCM 10 that includes two shingle stacked semiconductor devices 30A and 30B is depicted. Semiconductor devices 30A and 30B having, respectively, bond pads 33A and 33B, are disposed over a die attach region 16 of a lead frame 15. An interposer or redistribution layer, or "RDL" 14, is located over the upper semiconductor device 30B so as to provide access to bond pads 33B of semiconductor device 30B. Semiconductor devices 30A and 30B, RDL 14, and leads 19 are electrically connected to one another by way of bond wires 18. All of these features, with the exception of external portions of leads 19, are contained within a molded encapsulant 28. A stress concentration region 40, as shown by dashed lines, of MCM 10, which corresponds substantially to the area where the bulk of the integrated circuitry of semiconductor devices 30A and 30B is located, as well as to the location where the greatest amount of heat is generated during operation of semiconductor devices 30A and 30B, is also illustrated.

Figure 2A:
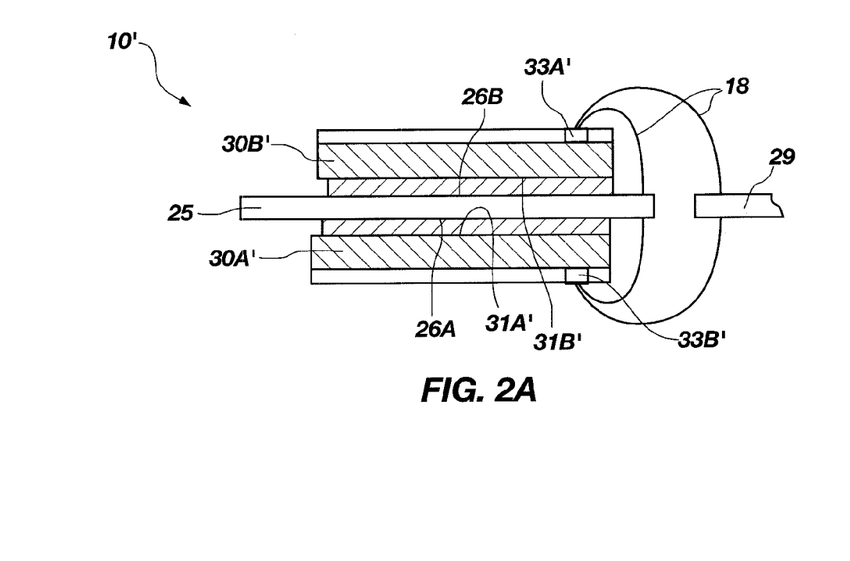
FIGS. 2A and 2B are partial cross-sectional representations of semiconductor device packages with semiconductor devices positioned on opposite sides of leads.

Regardless of configuration, MCMs typically have stress concentration regions, or regions where thermal mismatch stresses are greatest. In recognition of these regions, packages have been designed to spread out, or balance, the regions within MCMs where heat is generated, thereby effectively diluting the heat that exists within the MCM. For example, MCMs have been designed in which "mirror image" semiconductor devices with bond pads at single edges thereof, which are identical in function, but are arranged in connection patterns that mirror one another, are positioned on opposite sides of a lead frame. Such a package is depicted in FIG. 2A. Back sides 31A' and 31B' of mirror image semiconductor devices 30A' and 30B' are positioned on opposite surfaces 26A and 26B of floating leads 25 of the MCM 10' shown in FIG. 2A. Bond pads 33A' and 33B' of semiconductor devices 30A' and 30B' are located at the same side of MCM 10'. Bond wires 18 establish electrical connections between bond pads 33A' and 33B' and corresponding leads 25, 29. Some bond pads 33A',33B' are electrically connected to adjacent, conventional leads 29, which protrude from the side of MCM 10' next to which the bond pads 33A' and 33B' are located. Other bond pads 33A', 33B' are electrically connected to floating leads 25, which extend to and protrude from the opposite side of MCM 10', providing some balance in the number of leads that protrude from the opposite sides of MCM 10'.

The requirement of mirror image semiconductor devices 30A' and 30B' in such an assembly somewhat undesirably requires that an additional wafer mask set be generated for fabrication purposes, which increases fabrication costs and consumes valuable fabrication time, either by necessitating the use of additional equipment or by increasing down time as mask sets are replaced.

Figure 2B:
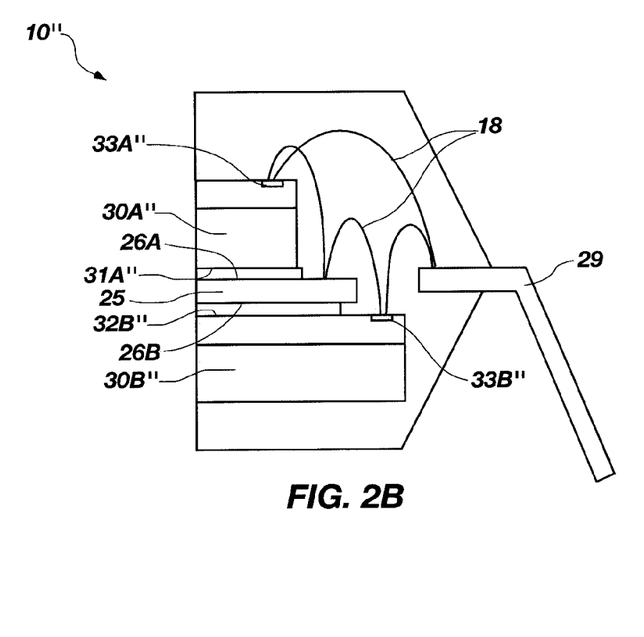

FIG. 2B depicts an MCM 10" in which identical semiconductor devices 30A" and 30B" are used, with a back side 31A" of the upper semiconductor device 30A" secured to a first surface 26A of floating leads 25 and an active surface 32B" of the lower semiconductor device 30B" secured to an opposite, second surface 26B of floating leads 25. As in MCM 10', all bond pads 33A" and 33B" of MCM 10" are located on one side of MCM 10".

As the arrangements shown in FIGS. 2A and 2B require every bond wire 18 to be located at a single side of MCM 10', 10", there may be significant congestion of bond wires 18. Such congestion may result in signal leakage, cross-talk, and electrical shorting. In addition, such congestion may create a practical limit on the pitch between bond pads 33A', 33B' or 33A", 33B", as well as on the number of bond pads 33A', 33B' or 33A", 33B" that may be placed along an edge of a semiconductor device 30A', 30B' or 30A", 30B". Congestion is compounded as additional semiconductor devices are added to the assembly.

The inventors are not aware of an MCM with maximized density and minimized thermal stress that is designed to avoid congested electrical connections.

BRIEF DESCRIPTION OF THE DRAWINGS

In the drawings, which depict examples of various aspects of the present invention.

DETAILED DESCRIPTION

The present invention includes semiconductor device assemblies and semiconductor device packages of minimal thickness with input/output elements, such as leads, that are substantially balanced in number from one side of the assembly or package to another side of the assembly or package.

In one aspect, a semiconductor device assembly or package that incorporates teachings of the present invention includes semiconductor devices that are positioned adjacent to opposite surfaces of floating leads. Bond pads of each semiconductor device on one side of the floating leads are located at a first side of the assembly or package. Bond pads of each semiconductor device on the opposite die of the floating leads are located at an opposite, second side of the assembly or package. The active surfaces of the semiconductor devices on opposite sides of the floating leads face different directions. Thus, the back sides of semiconductor devices on opposite sides of the floating leads may face and be secured to their corresponding surfaces of the floating leads, or the active surfaces of semiconductor devices on opposite sides of the floating leads may face and be secured to their corresponding surfaces of the floating leads.

The floating leads may connect corresponding bond pads to one another, and may facilitate electrical connection of a bond pad on one side of the assembly or package with an external feature (e.g., a terminal of a carrier substrate), at an opposite side of the assembly or package. Without limiting the scope of the present invention, the semiconductor devices of such an assembly or package may be identical to one another.

According to another aspect, the present invention includes offset lead assemblies with floating leads and conventional leads. An internal portion of such an assembly is located in a first plane, while an external portion of such an assembly is located in a second plane, which is offset from the first plane. The floating leads, or at least portions thereof, are part of the internal portion of such an offset lead assembly. The external portion of such an offset lead assembly includes conventional leads and may include end portions of at least some floating leads.

The distance that the first and second planes of an offset lead assembly of the present invention are spaced apart from one another may be tailored to facilitate positioning of a semiconductor device assembly including such leads substantially centrally relative to the thickness of a package encapsulant, while allowing the leads to protrude from the encapsulant at a desired location (e.g., centrally relative to the width of the encapsulant, at an offset location relative to the width of the encapsulant, etc.). Thus, an offset lead assembly may be configured to accommodate an odd number of semiconductor devices within a semiconductor device package, while balancing one or more physical characteristics of the package. Of course, semiconductor device assemblies and packages that include offset lead assemblies are also within the scope of the present invention.

Additionally, the present invention includes methods for designing lead assemblies, semiconductor device assemblies, and semiconductor device packages, as well as assembly and packaging methods.

Other features and advantages of the present invention will become apparent to those of ordinary skill in the art through consideration of the ensuing description, the accompanying drawings, and the appended claims.

Figure 3:
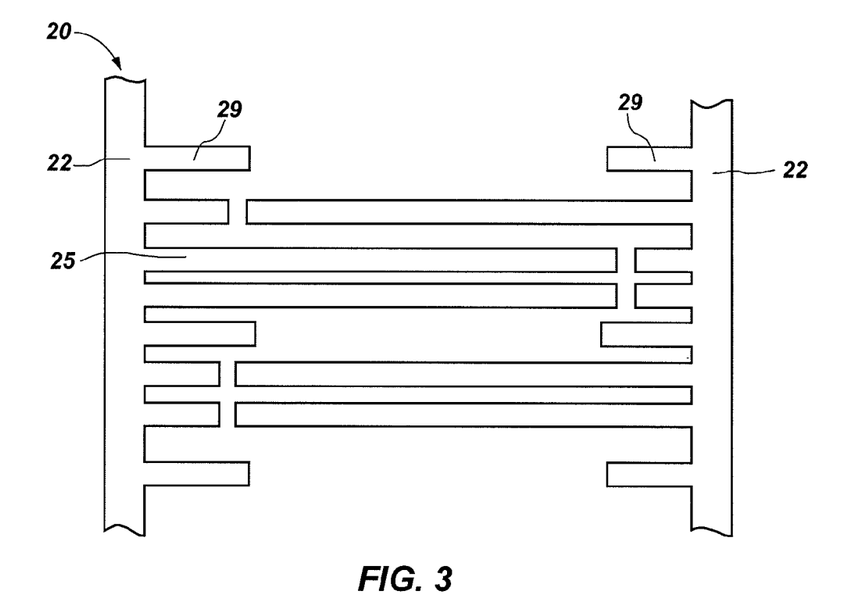
FIG. 3 depicts a simplified example of a lead frame that may be used in assemblies and assembly methods that incorporate teachings of the present invention.

In this regard, FIG. 3 shows a lead assembly 20 that may be used in accordance with teachings of the present invention. Lead assembly 20 includes peripherally located conventional leads 29, as well as more centrally located floating leads 25. Prior to being assembled with a semiconductor device (not shown), as well as just following such assembly, features, such as, but not necessarily, the depicted rails 22, may secure conventional leads 29 and floating leads 25 to one another.

Figure 4:
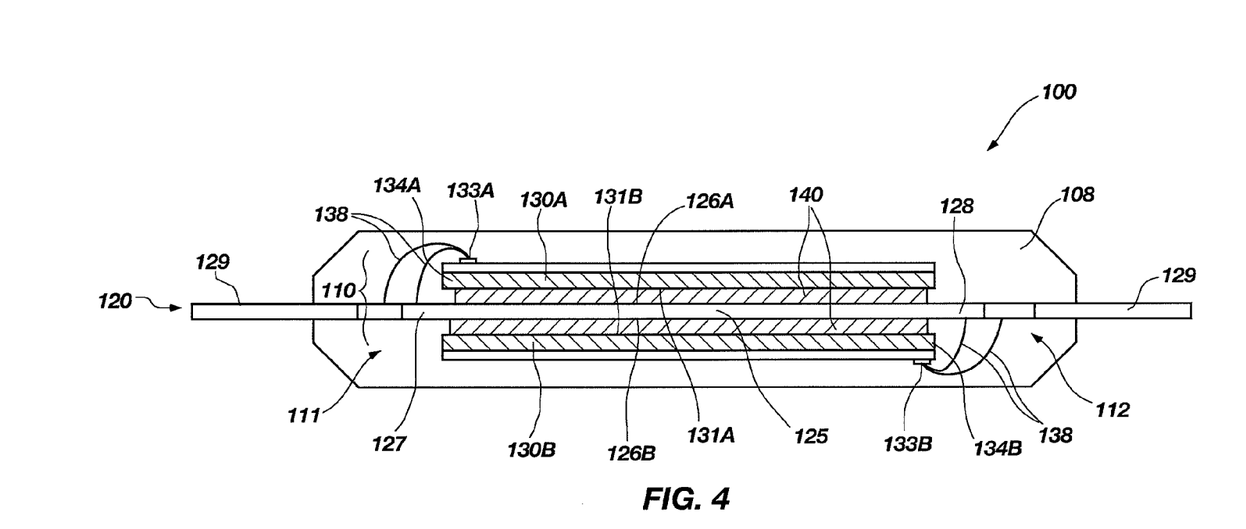
FIG. 4 is a cross-sectional representation of an example of a semiconductor device package according to the present invention, including an assembly in which back sides of semiconductor devices are secured to opposite sides of floating leads.

With reference to FIG. 4, an embodiment of a semiconductor device package 100 that incorporates teachings of the present invention is shown. Semiconductor device package 100 includes a semiconductor device assembly 110 and an encapsulant 108 around portions of semiconductor device assembly 110.

Semiconductor device assembly 110 includes two or more semiconductor devices 130A, 130B, etc. (which may be generically referred to hereinafter as "semiconductor devices 130") and leads 120.

Leads 120 include floating leads 125, and may also include conventional leads 129. Floating leads 125 may be substantially linear or bent. Floating leads 125 may be oriented in mutually parallel relation. Floating leads 125 are sandwiched between at least two semiconductor devices 130A and 130B, which may be identical to one another or different from one another. Each semiconductor device 130A, 130B includes bond pads 133A, 133B that are located adjacent to at least one peripheral edge 134A, 134B thereof.

Back sides 131A and 131B of semiconductor devices 130A and 130B are secured to opposite surfaces 126A and 126B, respectively, of floating leads 125. Any suitable adhesive material 140, including, without limitation, a quantity of adhesive material, an adhesive-coated film, or the like, may be used to secure semiconductor devices 130A and 130B to surfaces 126A and 126B, respectively, of floating leads 125.

As shown, bond pads 133A of a semiconductor device 130A, which are located adjacent to a first peripheral edge 134A of semiconductor device 130A, are electrically connected to a first surface 126A of floating leads 125 (e.g., by way of intermediate conductive elements 138). First peripheral edge 134A may be located at or near a first side 111 of semiconductor device assembly 110. Bond pads 133B of a semiconductor device 130B, which are located adjacent to a first peripheral edge 134B of semiconductor device 130B, may be electrically connected to a second surface 126B of floating leads 125 (e.g., by way of intermediate conductive elements 138). First peripheral edge 134B may be located at or near a second side 112 of semiconductor device assembly 110, which is opposite from first side 111 of semiconductor device assembly 110. If semiconductor devices 130A and 130B are identical to one another, identical bond pads 133A and 133B thereof may be substantially laterally aligned with each other.

Opposite ends 127 and 128 of floating leads 125 protrude from beyond first peripheral edges 134A and 134B, respectively, of semiconductor devices 130A and 130B. Thus, floating leads 125 may facilitate rerouting of some electrical signals from one side 111, 112 of semiconductor device assembly 110 to an opposite side 112, 111 of semiconductor device assembly 110.

Figure 5:
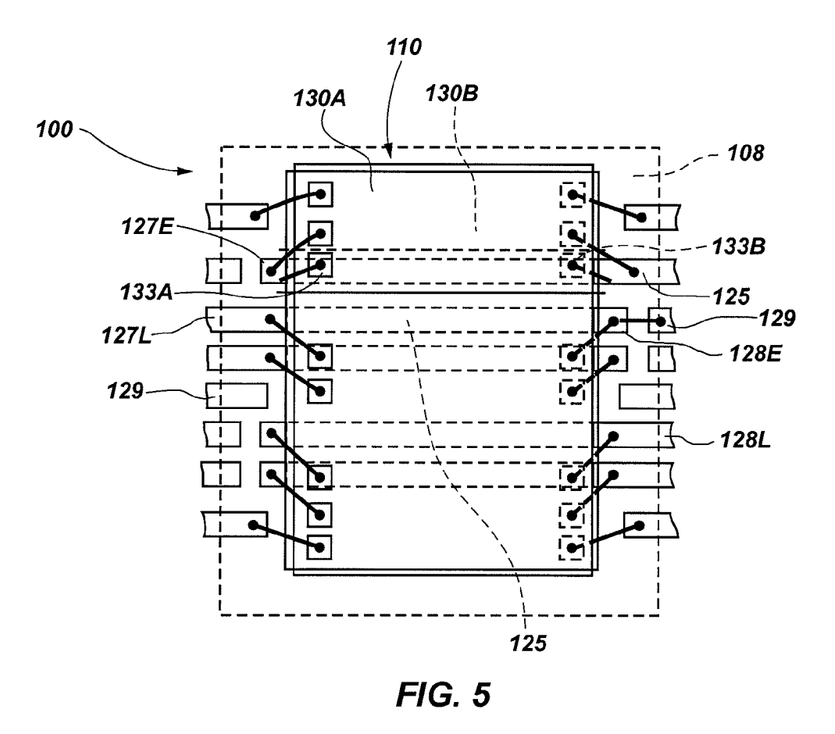
FIG. 5 shows an example of the various types of electrical connections that may be made between features of the semiconductor device package shown in FIG. 4.

With additional reference to FIG. 5, at least one floating lead 125 may extend from a location laterally adjacent to a bond pad 133A of semiconductor device 130A to a location laterally adjacent to an identical bond pad 133B of semiconductor device 130B. This arrangement facilitates electrical connection of the identical bond pads 133A and 133B to a single floating lead 125 (e.g., with intermediate conductive elements 138 (FIG. 4), such as the illustrated bond wires, etc.). When semiconductor devices 130A and 130B are identical to one another and their identical bond pads 133A and 133B are aligned, floating leads 125 that are oriented substantially parallel to one another may be electrically connected to corresponding pairs of identical bond pads 133A and 133B.

As illustrated, electrical connections may be made at a number of different levels within semiconductor device assembly 110. For example, bond pads 133A, 133B may be electrically connected to floating leads 125. One or both ends 127L, 128L of floating leads 125 may protrude from encapsulant 108 of semiconductor device package 100, or electrical connections may be made (e.g., by way of intermediate conductive elements 138) between one or more encapsulated ends 127E, 128E of shorter floating leads 125 and corresponding conventional leads 129 that protrude from encapsulant 108. In addition, other bond pads 133A, 133B may be electrically connected to conventional leads 129.

Figure 6:
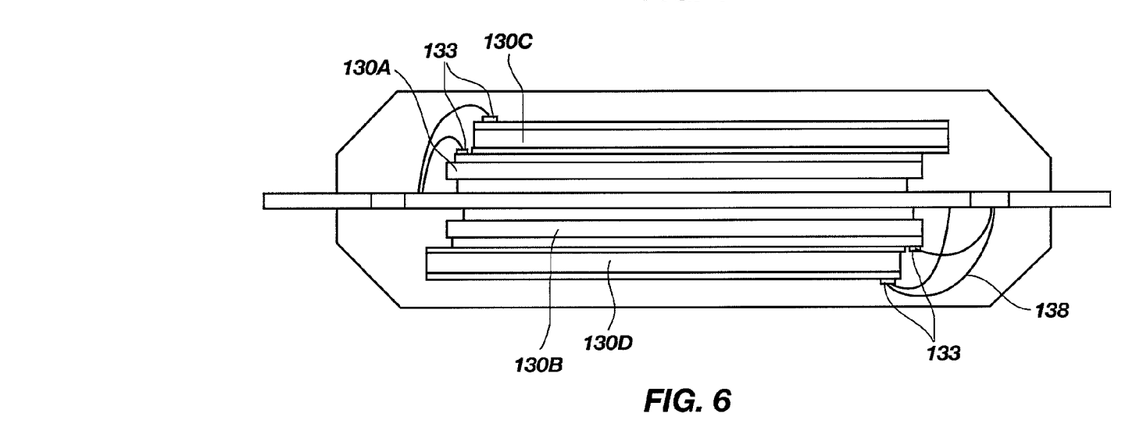
FIG. 6 illustrates, in cross-section, a semiconductor device package similar to that shown in FIGS. 4 and 5, with two additional semiconductor devices.

One or more additional semiconductor devices 130C, 130D, etc., may be stacked upon and secured to semiconductor device 130A and/or semiconductor device 130B, as shown in FIG. 6. In addition to the types of electrical connections noted above, intermediate conductive elements 138 may extend directly between bond pads 133 of directly adjacent stacked semiconductor devices (e.g., semiconductor devices 130A and 130C, semiconductor devices 130B and 130D, etc.).

Figure 7:
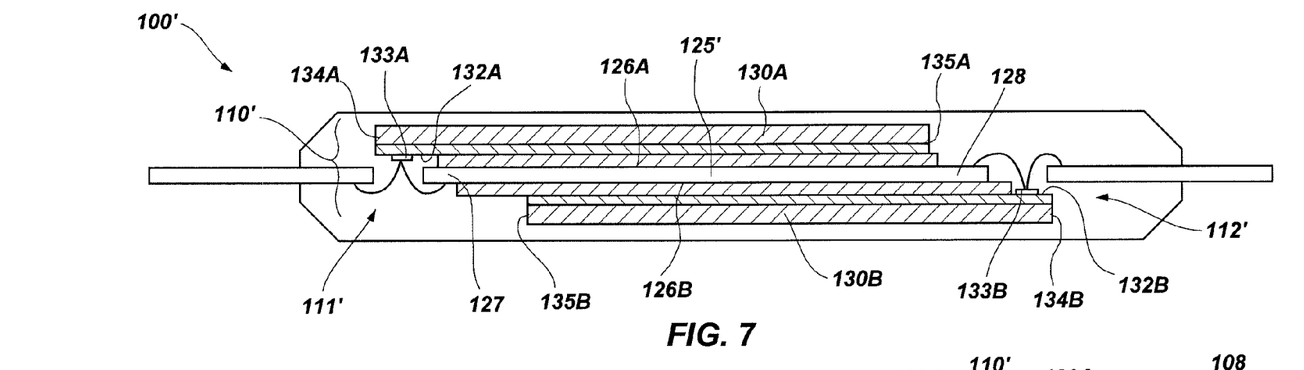
FIG. 7 is a cross-sectional representation of another example of a semiconductor device package according to the present invention, including an assembly in which active surfaces of semiconductor devices are secured to opposite sides of floating leads.
Figure 8:
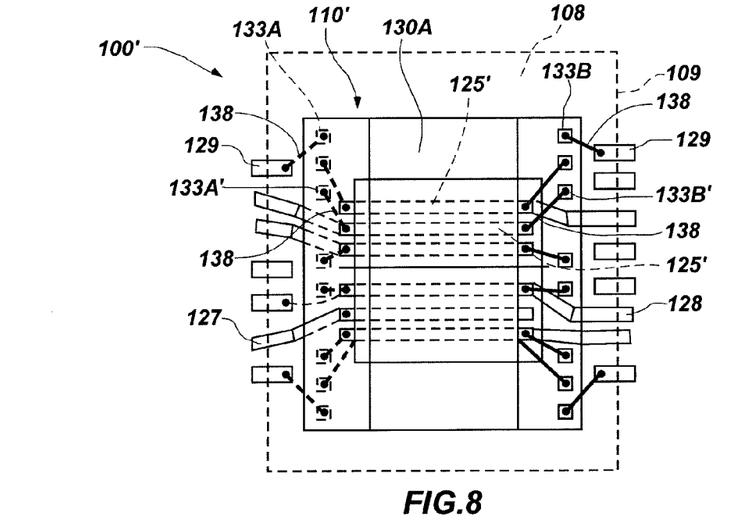
FIG. 8 shows an example of the various types of electrical connections that may be made between features of the semiconductor device package of FIG. 7.

Another embodiment of semiconductor device package 100' and the semiconductor device assembly 110' thereof is shown in FIGS. 7 and 8. Semiconductor device assembly 110' differs from semiconductor device assembly 110 in that active surfaces 132A and 132B of semiconductor devices 130A and 130B, respectively, face and are secured to surfaces 126A and 126B, respectively, of floating leads 125'. At least some bond pads 133A of semiconductor device 130A are located at a first peripheral edge 134A of semiconductor device 130A. First peripheral edge 134A is positioned adjacent to one side 111' of semiconductor device assembly 110'. A first peripheral edge 134B of semiconductor device 130B is positioned adjacent to an opposite side 112' of semiconductor device assembly 110', with at least some bond pads 133B of semiconductor device 130B being located adjacent to first peripheral edge 134B of semiconductor device 130B.

As depicted, semiconductor device 130A, floating leads 125', and semiconductor device 130B may be positioned in a stepped, or staggered, arrangement. In such an arrangement, at one side 111' of semiconductor device assembly 110', an end 127 of the depicted floating lead 125' is positioned over active surface 132A of semiconductor device 130A so as not to overlap any bond pads 133A thereof. Thus, bond pads 133A may be exposed beyond ends 127 of floating leads 125', between floating leads 125', etc. End 127 is also exposed beyond a peripheral edge 135B of semiconductor device 130B so that electrical connections may be made thereto, if desired. At the opposite side 112' of semiconductor device assembly 110', end 128 of the depicted floating lead 125' is exposed beyond an opposite peripheral edge 135A of semiconductor device 130A. End 128 is positioned over active surface 132B of semiconductor device 130B so as not to overlap any bond pads 133B thereof. Thus, bond pads 133B may be exposed beyond ends 128 of floating leads 125', between floating leads 125', etc.

FIG. 8 illustrates examples of electrical connections that may be included in semiconductor device assembly 110'. As shown, some bond pads 133A, 133B are directly connected (e.g., by way of intermediate conductive elements 138) to corresponding conventional leads 129. Other bond pads 133A', 133B' are electrically connected (e.g., by way of intermediate conductive elements 138) to floating leads 125', and may be connected to one another by way of floating leads 125'. Floating leads 125' may include ends 127, 128 that protrude beyond an outer surface 109 of encapsulant 108 of semiconductor device package 100'. Alternatively, floating leads 125' may, in turn, be electrically connected to corresponding conventional leads 129 (e.g., by way of intermediate conductive elements 138).

Figure 9:
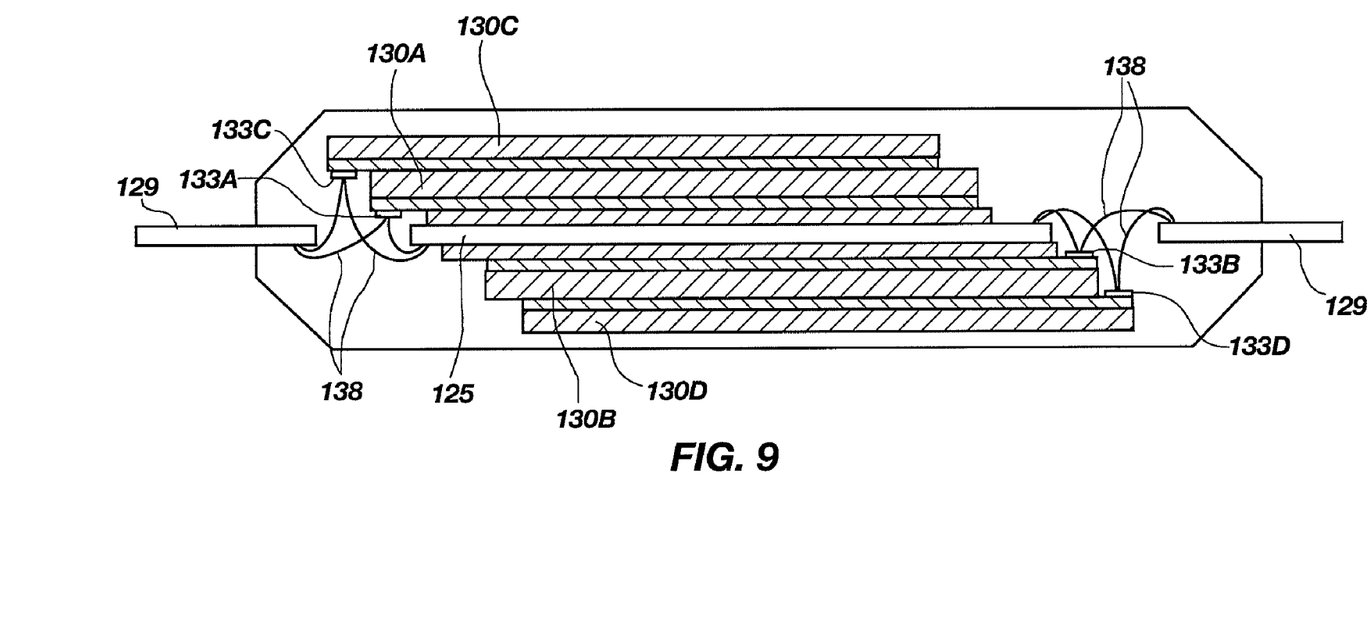
FIG. 9 illustrates, in cross-section, a semiconductor device package similar to that shown in FIGS. 7 and 8, with two additional semiconductor devices.

As shown in FIG. 9, an assembly of the embodiment shown in FIGS. 7 and 8 may include more than two semiconductor devices 130A, 130B, 130C, 130D, etc. Intermediate conductive elements 138 may electrically connect bond pads 133A and 133C, 133B and 133D of directly adjacent semiconductor devices 130A and 130C, 130B and 130D, respectively, to one another or to leads 125, 129, or connect leads 125, 129 to each other.

As bond pads of identical semiconductor devices may be connected by way of floating leads 125, but positioned at opposite sides of a semiconductor device assembly, congestion in electrical connections may be reduced. By orienting semiconductor devices 130A and 130B in such a way that there is no need for a redistribution element, such as an interposer or redistribution layer, the package is thinner (see, e.g., FIG. 7) than it would otherwise be if a redistribution element was present (see, e.g., FIG. 1) and the overall density of the package is greater than it would otherwise be.

Figure 10:
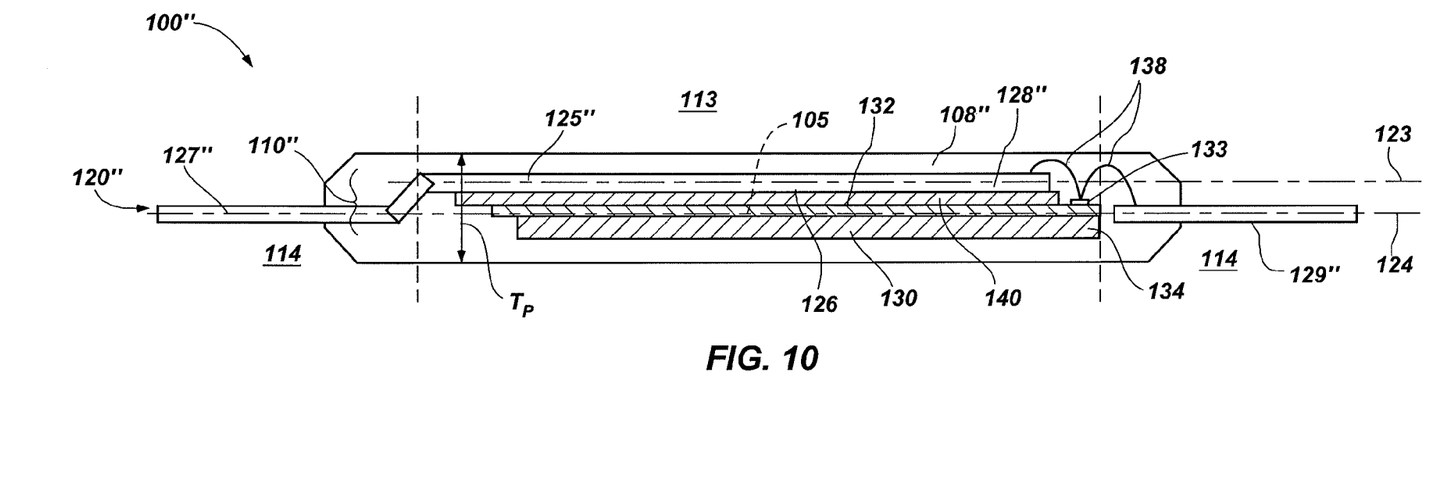
FIGS. 10 and 11 are cross-sectional representations of examples of semiconductor device packages that include lead frames with internal and external regions that are offset relative to one another to substantially balance a semiconductor device assembly including an odd number of semiconductor devices within the thickness of an encapsulant, while also substantially balancing the number of leads at opposite sides of the package.

Turning now to FIG. 10, another embodiment of a semiconductor device package 100" that incorporates teachings of the present invention is shown. Semiconductor device package 100" includes a semiconductor device assembly 110" with a lead assembly 120" that includes leads 125", 129" that are in at least two different planes. More specifically, lead assembly 120" includes a central, internal portion 113 in a first plane 123 and an external portion 114 in a second plane 124. The first and second planes 123 and 124 are offset relative to one another. As shown, centrally located portions of floating leads 125" are located within first plane 123, while at least the external portions of conventional leads 129" are located in second plane 124, as are any ends 127", 128" of floating leads 125" that protrude from encapsulant 108" of semiconductor device package 100".

Internal portion 113 has an area that is large enough area to accommodate a semiconductor device 130. The distance that first plane 123 and second plane 124 are spaced apart from one another may be tailored to position the thickness of central portion 113 of semiconductor device assembly 110" substantially centrally within the thickness $T_P$ of semiconductor device package 100", while permitting conventional leads 129" and any externally protruding ends 127", 128" of floating leads 125" to extend from a location that is substantially at the center 105 of the thickness of semiconductor device package 100".

As illustrated, an active surface 132 of a semiconductor device 130 may be secured (e.g., by way of adhesive material 140) to surface 126 of floating leads 125". Bond pads 133 of semiconductor device 130, which are located adjacent to a peripheral edge 134 thereof, are electrically connected (e.g., by intermediate conductive elements 138) to adjacent portions (e.g., ends 128") of corresponding floating leads 125", which may or may not extend beyond peripheral edge 134, or to conventional leads 129".

Figure 11:
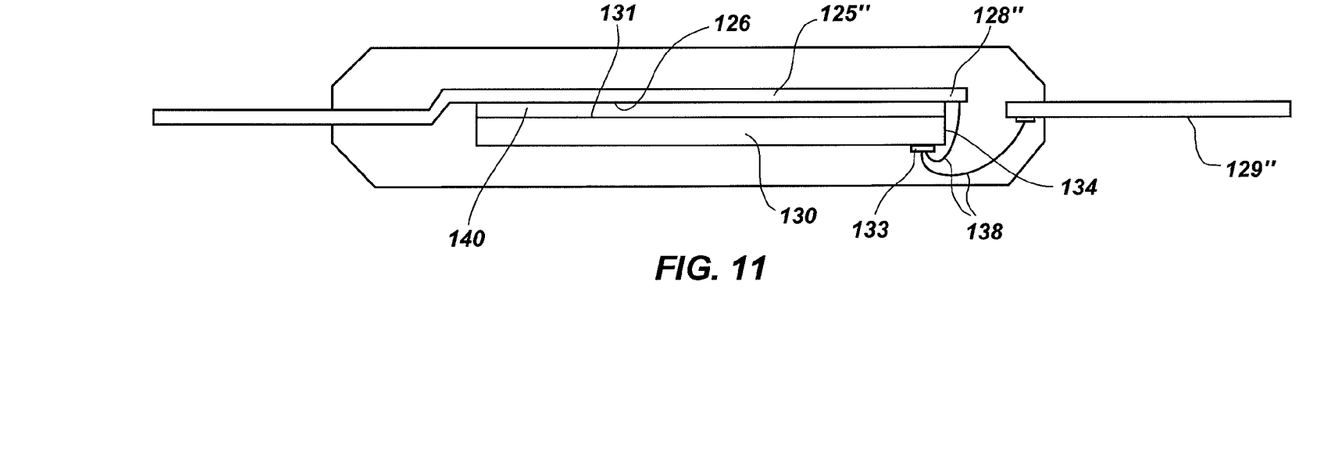

Alternatively, as shown in FIG. 11, a back side 131 of a semiconductor device 130 may be secured (e.g., by way of adhesive material 140) to surface 126 of floating leads 125". Bond pads 133 of semiconductor device 130, which are located adjacent to a peripheral edge 134 thereof, are electrically connected (e.g., by intermediate conductive elements 138) to ends 128" of corresponding floating leads 125", which extend beyond peripheral edge 134, or to conventional leads 129".

Although semiconductor device package 100" is illustrated as including only one semiconductor device 130, the offset between planes 123 and 124 facilitates the inclusion of any odd number (e.g., 1, 3, 5, etc.) of semiconductor devices 130 within a semiconductor device package, while balancing a thickness of a semiconductor device assembly (e.g., semiconductor device assembly 110") relative to the thickness of encapsulant (e.g., encapsulant 108") of the semiconductor device package (e.g., semiconductor device package 100").

Figure 12:
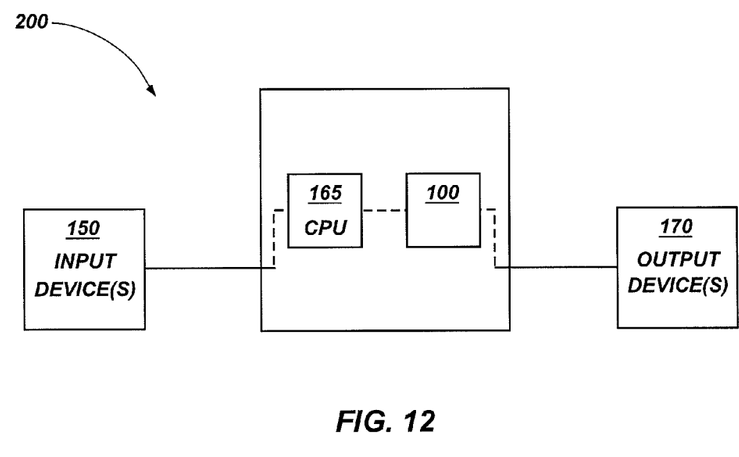
FIG. 12 is a schematic representation of an electronic device or system, such as a computer, that includes a lead frame, semiconductor device assembly, semiconductor device package, or other apparatus of the present invention.

In FIG. 12, an electronic device or system 200, such as a computer, storage device, cellular telephone, personal digital assistant (PDA), or the like, is schematically depicted. System 200 includes one or more lead assemblies, semiconductor device assemblies, or semiconductor device packages according to the present invention, which are collectively identified in FIG. 12 by reference character 100. When system 200 comprises a computer, it may additionally include other elements, such as a processing element 165 (e.g., a central processing unit or other logic device), memory devices (not shown) and a variety of other features. Additionally one or more input devices 150 (e.g., a mouse, keyboard, hard drive, microphone, etc.) and one or more output devices 170 (e.g., a monitor, printer, speaker, etc.) may be included in system 200.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. A semiconductor device assembly, comprising:
    leads including opposite first and second surfaces; and
    at least two semiconductor devices facing opposite directions,
        a first semiconductor device of the at least two semiconductor devices secured to the first surface of the leads with a back side of the first semiconductor device facing the first surface of the leads,
        a second semiconductor device of the at least two semiconductor devices secured to the second surface of the leads with a back side of a second semiconductor device facing the second surface of the leads,
        each of the at least two semiconductor devices including opposite first and second peripheral edges, with at least one bond pad being located adjacent to the first peripheral edge of each of the at least two semiconductor devices, first edges of the first and second semiconductor devices being located at opposite sides of the semiconductor device assembly,
        at least one of the leads being exposed beyond at least second peripheral edges of the first and second semiconductor devices.

2. The semiconductor device assembly of claim 1, wherein the first and second semiconductor devices are identical to one another.

3. The semiconductor device assembly of claim 1, wherein active surfaces of the first and second semiconductor devices face the first and second surfaces of the leads.

4. The semiconductor device assembly of claim 1, further comprising:
    an intermediate conductive element extending directly between the at least one bond pad of the first semiconductor device and the at least one lead; and
    another intermediate conductive element extending directly between the at least one bond pad of the second semiconductor device and the at least one lead.

5. A semiconductor device assembly, comprising:
    a first semiconductor device;
    a lead including:
        a first surface secured to and extending across a back side of the first semiconductor device;
        a second surface opposite from the first surface; and
        opposite ends extending laterally beyond opposite peripheral edges of the first semiconductor device; and
    a second semiconductor device identical to the first semiconductor device and including a back side secured to the second surface of the at least one lead, the opposite ends of the at least one lead extending laterally beyond opposite peripheral edges of the second semiconductor device;

a first intermediate conductive element electrically connecting a bond pad of the first semiconductor device to an adjacent portion of the lead; and a second intermediate conductive element electrically connecting a bond pad of the second semiconductor device, which is identical to the bond pad of the first semiconductor device, to an adjacent portion of the lead.

6. The semiconductor device assembly of claim 5, wherein the bond pad of the first semiconductor device is located adjacent to a first peripheral edge of the semiconductor device assembly and the bond pad of the second semiconductor device is located adjacent to an opposite, second peripheral edge of the semiconductor device assembly.

7. The semiconductor device assembly of claim 6, wherein a first end of the lead extends laterally beyond the first peripheral edge of the semiconductor device assembly and a second end of the lead extends laterally beyond the second peripheral edge of the semiconductor device assembly.

8. The semiconductor device assembly of claim 5, wherein the lead is substantially aligned with identical bond pads of the first and second semiconductor devices.

9. The semiconductor device assembly of claim 5, comprising:
  a plurality of leads extending substantially parallel to one another;
  identical first bond pads of the first and second semiconductor devices electrically connected to opposite ends of a first of the plurality of leads; and
  identical second bond pads of the first and second semiconductor devices electrically connected to opposite ends of a second of the plurality of leads.

10. The semiconductor device assembly of claim 5, further comprising:
  a third semiconductor device positioned over the first semiconductor device.

11. The semiconductor device assembly of claim 10, wherein the third semiconductor device is identical to the first and second semiconductor devices.

12. The semiconductor device assembly of claim 10, further comprising:
  a fourth semiconductor device positioned over the second semiconductor device.

13. The semiconductor device assembly of claim 12, wherein the fourth semiconductor device is identical to the first and second semiconductor devices.

14. A semiconductor device assembly, comprising:
  a first semiconductor device including opposite first and second peripheral edges and bond pads located adjacent to the first peripheral edge;
  at least one lead including:
    a first surface secured to and extending across an active surface of the first semiconductor device;
    a second surface opposite from the first surface;
    a first end that does not extend laterally beyond the first peripheral edge of the first semiconductor device; and
    a second end opposite from the first end extending laterally beyond a second peripheral edge of the first semiconductor device; and
  the second semiconductor device identical to the first semiconductor device and including an active surface secured to the second surface of the at least one lead and a first peripheral edge adjacent to which bond pads are located, the second end of the at least one lead not extending laterally beyond the first peripheral edge of the second semiconductor device, the first end of the at least one lead extending laterally beyond an opposite, second peripheral edge of the second semiconductor device;

a first intermediate conductive element electrically connecting a bond pad of the first semiconductor device, which is adjacent to a first peripheral edge of the first semiconductor device, to an adjacent portion of a first end of the at least one lead; and a second intermediate conductive element electrically connecting a bond pad of the second semiconductor device to an adjacent portion of a second end of the at least one lead.

15. The semiconductor device assembly of claim 14, wherein the bond pad of the first semiconductor device is located adjacent to a first peripheral edge of the semiconductor device assembly and the bond pad of the second semiconductor device is located adjacent to an opposite, second peripheral edge of the semiconductor device assembly.

16. The semiconductor device assembly of claim 14, wherein the at least one lead is substantially in-line with the bond pad of the first semiconductor device and the bond pad of the second semiconductor device.

17. The semiconductor device assembly of claim 14, comprising:
  a plurality of leads extending substantially parallel to one another;
  first bond pads of the first and second semiconductor devices electrically connected to a first of the plurality of leads; and
  second bond pads of the first and second semiconductor devices electrically connected to a second of the plurality of leads.

18. The semiconductor device assembly of claim 14, further comprising:
  a third semiconductor device positioned over the first semiconductor device.

19. The semiconductor device assembly of claim 18, wherein the third semiconductor device is identical to the first and second semiconductor devices.

20. The semiconductor device assembly of claim 18, further comprising:
  a fourth semiconductor device positioned over the second semiconductor device.

21. The semiconductor device assembly of claim 20, wherein the fourth semiconductor device is identical to the first and second semiconductor devices.

22. A lead assembly, comprising:
  an internal portion located in a first plane and including at least a portion of at least one floating lead that is configured to be secured to at least one semiconductor device and to extend from a first side of the at least one semiconductor device beyond a midpoint of the at least one semiconductor device; and
  an external portion located in a second plane, which does not coincide with the first plane, and including leads that are configured to protrude from a semiconductor device package including the lead assembly and the at least one semiconductor device.

23. The lead assembly of claim 22, wherein the external portion also includes a portion of the at least one floating lead.

24. A semiconductor device assembly, comprising:
  at least one semiconductor device with bond pads located adjacent to a first peripheral edge thereof; and a lead assembly, including:
- an internal portion located in a first plane and including at least a portion of at least one floating lead that is secured to an active surface of the at least one semiconductor device; and
- an external portion located in a second plane, positioned laterally around the at least one semiconductor device, and including leads for facilitating electrical connection with the at least one semiconductor device; and at least one intermediate conductive element electrically connecting at least one bond pad of the bond pads of the at least one semiconductor device to an adjacent portion of at least one floating lead.

25. The semiconductor device assembly of claim 24, comprising an odd number of semiconductor devices.

\* \* \* \* \*